United States Patent [19]

Tung et al.

[11] Patent Number: 5,225,253
[45] Date of Patent: Jul. 6, 1993

[54] METHOD OF FORMING SILVER/MOLYBDENUM SURFACE COATING MATERIAL

[75] Inventors: Simon C. Tung, Rochester; Yang-Tse Cheng, Rochester Hills, both of Mich.

[73] Assignee: General Motors Corporation, Detroit, Mich.

[21] Appl. No.: 870,378

[22] Filed: Apr. 17, 1992

[51] Int. Cl.⁵ .................... B05D 3/06; B05D 3/00; C23C 16/00
[52] U.S. Cl. .................... 427/566; 427/255.2; 427/295; 427/327; 427/328
[58] Field of Search .............. 427/35, 42, 124, 255.2, 427/295, 255.1

[56] References Cited

U.S. PATENT DOCUMENTS

| | | | |
|---|---|---|---|
| 4,129,167 | 12/1978 | Sigsbee | 427/124 |
| 4,362,765 | 12/1982 | Abe et al. | 427/124 |
| 4,828,655 | 5/1989 | Wang et al. | 204/38.1 |
| 4,963,394 | 10/1990 | Willer | 427/255.1 |
| 5,032,421 | 7/1991 | Sarma et al. | 427/124 |

OTHER PUBLICATIONS

Mat. Res. Soc. Symp. Proc. vol. 187 1990 Materials Research Society, pp. 33–39, "Al–Ge Phase Separation During Vapor Deposition".

Primary Examiner—Michael Lusigan
Assistant Examiner—David M. Maiorana
Attorney, Agent, or Firm—Randy W. Tung

[57] ABSTRACT

A method of forming friction-reducing and wear-resistant silver/molybdenum coating material by co-depositing quantities of silver and molybdenum simultaneously forming nano-crystalline binary mixtures on iron surfaces.

7 Claims, 2 Drawing Sheets

METHOD OF FORMING SILVER/MOLYBDENUM SURFACE COATING MATERIAL

FIELD OF THE INVENTION

This invention generally relates to a method of forming friction-reducing and wear-resistant silver/molybdenum coating material on iron surfaces and, more particularly, is concerned with the method of forming friction-reducing and wear-resistant silver/molybdenum coating material by co-depositing quantities of silver and molybdenum simultaneously forming nano-crystalline binary mixtures on iron surfaces.

BACKGROUND OF THE INVENTION

In many industrial applications wherein sliding motions between metal-to-metal contact cannot be avoided, methods to reduce the friction and wear of the metal surfaces are highly desirable. These applications are frequently encountered in the automotive industry and in the electronics industry. For instance, in the automotive industry, engine friction and wear reduction by using additives in lubricants is one of the most frequently used approaches. Additives used in lubricants to reduce friction and wear achieve its purpose by creating chemical reactions between the additives and the metal surfaces. However, these chemical reactions are very slow and the reaction films thus formed are generally not uniform. In electronic applications such as that of a switching device, it is difficult to reduce the dry friction and wear problems between metal surfaces since no lubricants can be used to reduce such friction.

The frictional characteristics of surface coatings are controlled by their chemical compositions and their microstructures such as crystallinity and grain size distribution. In many advanced mechanical or electronic systems, materials need to operate in harsh environments and under severe frictional conditions.

It is, therefore, an object of the present invention to provide a method of coating iron surfaces with a friction-reducing and wear-resistant silver/molybdenum coating material.

It is another object of the present invention to provide a method of coating iron surfaces with a silver/-molybdenum coating material by simultaneously co-depositing quantities of silver and molybdenum on iron surfaces.

It is yet another object of the present invention to provide a method of coating iron surfaces with a silver/molybdenum friction-reducing and wear-resistant coating material by simultaneously co-depositing quantities of silver and molybdenum in a nano-crystalline binary mixture on iron surfaces by electron-beam evaporation technique.

SUMMARY OF THE INVENTION

Friction-reducing and wear-resistant films are produced by co-depositing quantities of silver and molybdenum on iron surfaces for example steel alloy surfaces. Nano-crystalline binary (two-phase) mixtures were obtained by the simultaneous electron-beam evaporation from two sources of silver and molybdenum.

Frictional tests were conducted on the films produced by using a Cameron-Plint High Frequency Pin-on-Plate Friction Machine. A silver-rich film (69 percent Ag 31 percent Mo) provided the lowest friction during the first ten hours of sliding. It has a 20 percent reduction in friction compared with an uncoated iron surface. A molybdenum-rich film (66 percent Mo, 34 percent Ag) also showed improved frictional properties on the iron surfaces when compared with uncoated iron surface and iron surface coated with pure silver or pure molybdenum.

We have discovered that the benefit provided by the silver-rich film and the molybdenum-rich film is due to the low shear strength and high thermal conductivity of silver and the anti-scuffing property of molybdenum. The silver/molybdenum film is able to effectively dissipate the frictional heat that contributes to thermal mechanical wear and to resist scuffing and thereby reduce friction and micro-structure induced wear.

After sliding for three hours against a steel sphere, a bare steel plate showed substantial wear and plastic deformation. In contrast, a plate coated with a thin layer of either silver-rich or molybdenum-rich film showed a smoother surface. The improved frictional characteristics of the films are due to the greater shearing capability as a result of reduced Young's modulus for the film compared to that of the bulk materials.

BRIEF DESCRIPTION OF THE DRAWINGS

Other objects, features and advantages of the present invention will become apparent upon consideration of the specification and the appended drawings, in which.

DETAILED DESCRIPTION OF A PREFERRED EMBODIMENT

Figure 1:
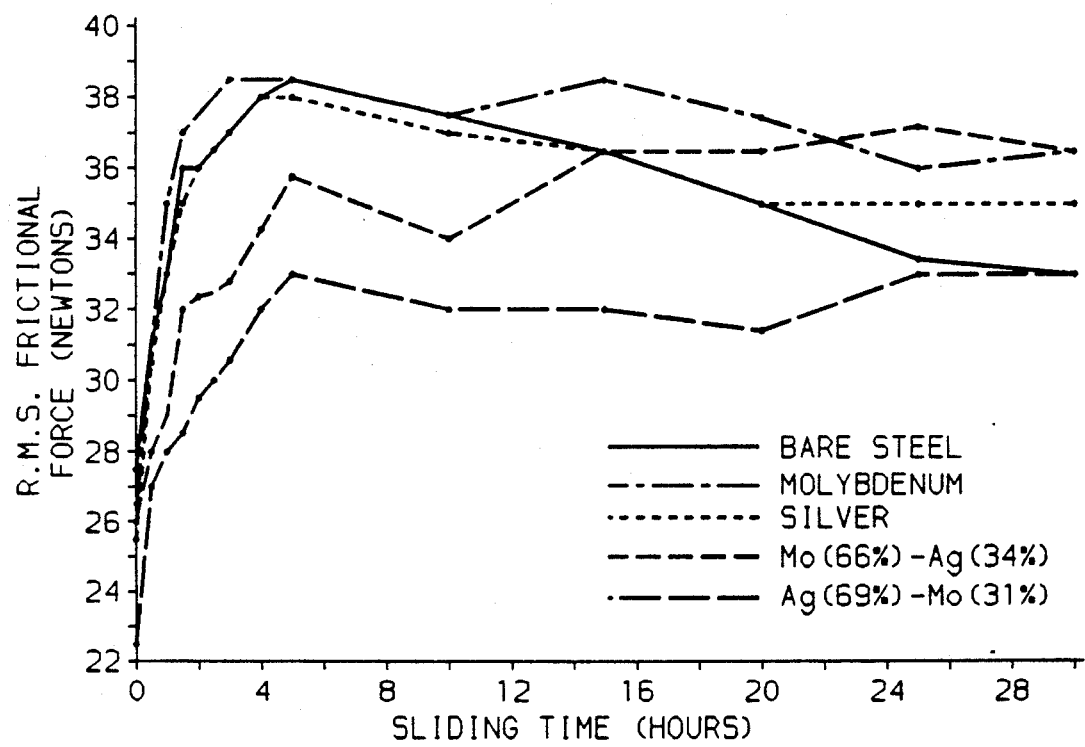
FIG. 1 is a graph showing the results of friction tests on different surface coatings and uncoated steel plate.
Figure 2A:
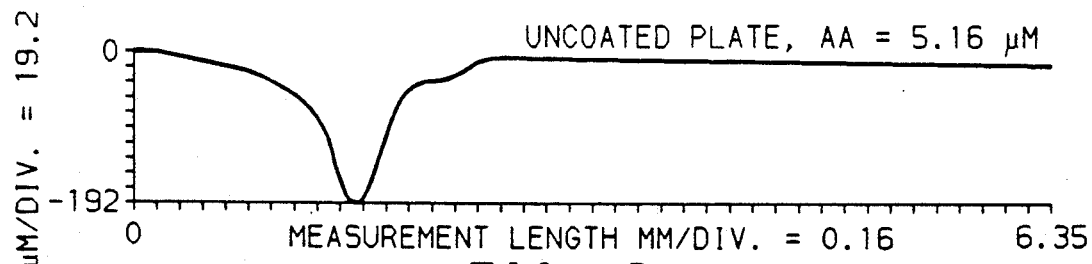
FIGS. 2a, 2b, 2c, 2d, 2e are graphs showing surface profiles and average roughness measurements of wear tracks of the uncoated and coated plates after sliding for 30 hours.
Figure 2B:
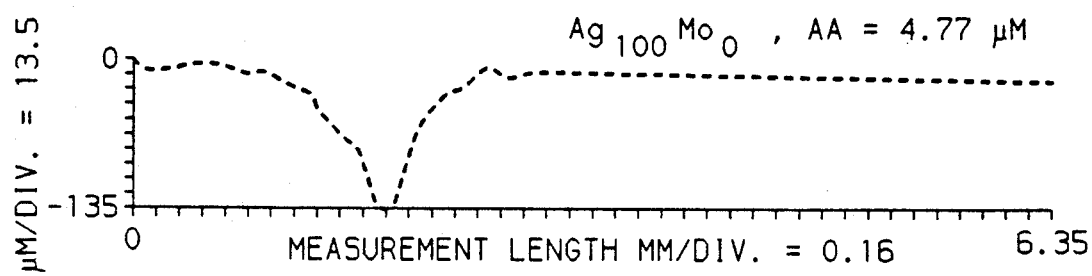
Figure 2C:
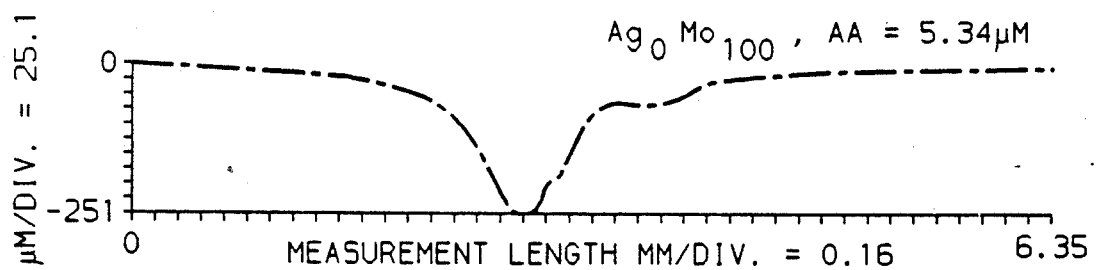
Figure 2D:
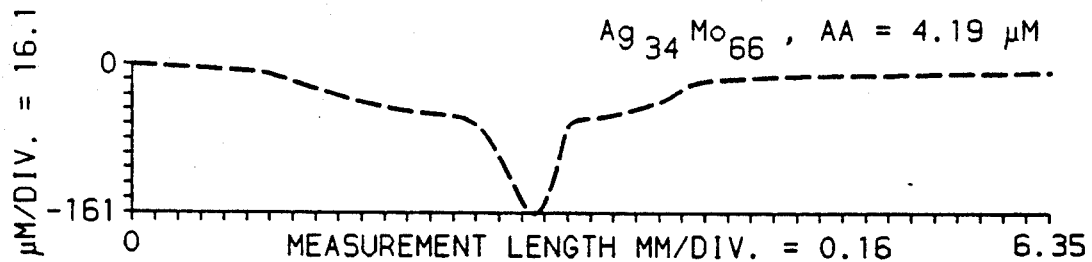
Figure 2E:
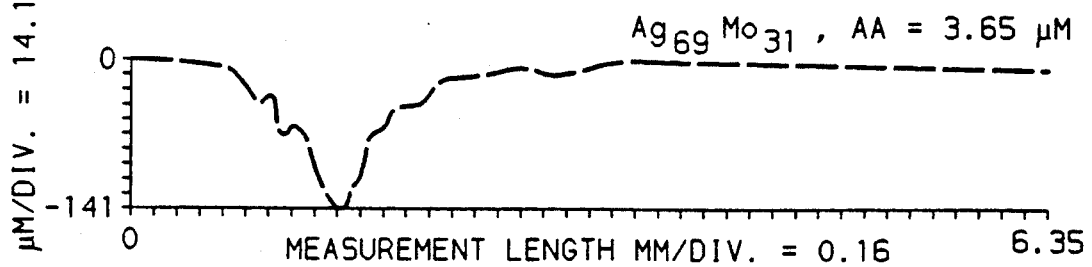

It is well known that silver and molybdenum are immiscible and single-phase alloys of the two metals cannot exist in thermodynamic equilibrium. As a consequence, even though silver is known for its high thermal conductivity, low shear strength and superior chemical inertness, and molybdenum is known for its friction-reducing properties, no previous attempts have been made by others to combine these two materials as a friction-reducing and wear-resistant coating. We have discovered a unique and novel method in which silver and molybdenum can be co-deposited on iron surfaces in nano-crystalline microstructures by using a simultaneous electron-beam evaporation technique.

Steel substrates made of oil hardened C—Cr—Mn alloy tool steel having 60 Rockwell C hardness are polished to an arithmetic average mean surface roughness of 0.24 $\mu$m. The substrates are subsequently cleaned in acetone and methanol for ten minutes each before being loaded into an ultra-high vacuum chamber for thin film deposition. The base pressure of the ultra-high vacuum chamber was less than $5.5 \times 10^{-9}$ torr. Before depositing the thin films, the steel substrates were sputter cleaned using 500 eV argon ions from a Kaufmann type ion source. The ion beam removed native oxides from the substrate surface and enhanced the adhesion between the film and the substrate.

Simultaneous co-deposition of Ag and Mo was accomplished by electron-beam evaporation from two sources, i.e., one containing 99.9 percent pure Ag and the other containing 99.9 percent pure Mo. We believe that silver and molybdenum having 95 percent purity or better should work equally well. The overall composition of the thin film was determined by the relative rates of deposition from the two sources. Typical deposition rates range from 0.05 to 0.2 nm/sec. The substrate temperature during deposition was between 30° to 60° C. Thin film samples of a nominal thickness of 150 nm were deposited onto steel substrates at atomic ratios for Ag and Mo of 100:0 ($Ag_{100}Mo_0$), 69:31 ($Ag_{69}Mo_{31}$, designated as "silver-rich"), 50:50 ($Ag_{50}Mo_{50}$), 34:66 ($Ag_{34}Mo_{66}$, designated as "moly-rich"), and 0:100 ($Ag_0Mo_{100}$). We believe that any film thickness over 100 nm should be adequate to achieve our friction-reducing and wear-resistant purpose.

To examine the microstructures of the co-deposited Ag—Mo thin films, transmission electron microscopy (TEM) was used to determine the grain size. Samples with a nominal thickness of 20 nm and compositions $Ag_{69}Mo_{31}$ and $Ag_{33}Mo_{67}$ were deposited onto single crystal NaCl substrates under conditions similar to those used for the 150 nm thin films deposited on steel substrates. The NaCl substrates were then dissolved and the microstructures of the thin film were determined using TEM. The TEM pictures show that the co-deposited thin films are two-phase mixtures of crystalline Ag and Mo. The average grain sizes of Ag and Mo in the silver-rich films ($Ag_{69}Mo_{31}$) are 47 and 8 nm, respectively. The average grain sizes of Ag and Mo in moly-rich films ($Ag_{34}Mo_{67}$) are 10 and 15 nm, respectively. Therefore, these thin films are binary mixtures of nano-crystals. By nano-crystals, we mean crystals having dimensions between several nanometers to several hundred nanometers. Since the 150 nm thick films on steel substrates were prepared under similar conditions, they were expected to be mixtures of nano-crystals as well.

To evaluate the effect of different surface coatings on sliding friction, a Cameron-Plint High Frequency Pin-on-Plate Friction Machine was used. In this machine, a bare steel plate made of oil hardened C—Cr—Mn tool steel having 60 Rockwell C hardness and a dimension of 58×38 mm or a coated plate of the same material and dimension was positioned in the machine. All tests were conducted without lubrication. A moving 6 mm diameter-bearing specimen made of bearing steel under U.S. standard AISI-1010 steel having 35-42 Rockwell C hardness and embedded in a bronze sleeve was clamped in a head and oscillated against a plate in the horizontal direction. The head was located at the free end of a Scotch yoke assembly, and the assembly was driven by a controlled variable speed motor. The sphere was loaded against the fixed plate by a spring balance. During testing, the tangential frictional force between the fixed end moving specimens was monitored by a piezoelectric transducer attached to the insulating block. Friction traces were displayed on an oscilloscope screen.

A graph showing root mean square frictional force plotted against the sliding time is shown in FIG. 1. At the beginning of the test, a reference test was first conducted without lubrication using a bare steel plate. The frictional force for the steel sphere rubbing against both coated and uncoated plates gradually increased with time during the first five hours of sliding. In the first five hours of dry sliding, these traces demonstrate that the frictional force for the uncoated plate is higher than that of the co-deposited plates of either silver-rich or moly-rich. The data plotted in FIG. 1 is also shown in Table I. It is seen that the root mean square frictional force for the steel plate is reduced from 27.5N to 22.5N when coated with silver-rich films. This occurs after approximately one minute of sliding due to the formation of an adherent silver coating on the uncoated sphere as a result of metal transfer. In a similar manner, using the silver-coated plate, the frictional force was reduced to 25.5N. As sliding time increases, friction was quickly increased for all plates. Among the coated plates, friction was lowest with the silver-rich (69 percent Ag and 31 percent Mo) specimen at all times during the sliding tests. At below 15 hours sliding time, both silver-rich and moly-rich specimens show significant improvement than the other samples.

TABLE I

Root Mean Square (R.M.S.) Friction Force (Newtons) Comparisons for Different Surface Coatings and the Uncoated Steel Plate

| Sliding Time (hrs) | Bare Metal | Mo-Coated | Ag-Coated | Mo (66%)-Ag (34%) | Ag (50%)-Mo (50%) | AG (69%) Mo (31%) |
|---|---|---|---|---|---|---|
| 0.0 | 27.5 | 26.5 | 25.5 | 27.0 | 24.38 | 22.5 |
| 0.5 | 31.0 | 28.5 | 30.5 | 28.5 | 28.0 | 27.0 |
| 1.0 | 33.0 | 35.0 | 33.0 | 30.0 | 28.5 | 28.0 |
| 1.5 | 36.0 | 37.0 | 35.0 | 32.0 | 29.5 | 28.5 |
| 2.0 | 36.0 | 37.5 | 36.0 | 32.5 | 31.0 | 29.5 |
| 2.5 | 36.5 | 38.0 | 36.5 | 32.7 | 32.0 | 30.0 |
| 3.0 | 37.0 | 38.5 | 37.0 | 33.0 | 33.0 | 30.5 |
| 4.0 | 38.0 | 38.5 | 38.0 | 34.5 | 34.0 | 32.0 |
| 5.0 | 38.5 | 38.5 | 38.0 | 36.0 | 35.5 | 33.0 |
| 10.0 | 37.5 | 37.5 | 37.0 | 34.0 | 35.0 | 32.0 |
| 15.0 | 36.5 | 38.5 | 36.5 | 36.5 | 37.0 | 32.0 |
| 20.0 | 35.0 | 37.5 | 35.0 | 36.5 | 38.0 | 31.5 |
| 25.0 | 33.5 | 36.0 | 35.0 | 37.0 | 39.0 | 33.0 |
| 30.0 | 33.0 | 36.5 | 35.0 | 36.5 | 34.5 | 33.0 |
| 35.0 | 32.5 | 35.0 | 34.0 | 35.0 | — | 32.5 |
| 40.0 | 32.5 | 33.5 | 33.0 | 33.5 | — | 32.5 |

FIG. 1 also shows that the frictional force for all surface coatings initially increase with time but after approximately four hours of sliding leveled off. No reduction in frictional force for either the silver-rich or the moly-rich coatings were observed after 25 hours sliding time indicating that the coatings were worn off. All coated surfaces showed grooves and debris surrounding the wear track. In contrast, the frictional force for uncoated steel after five hours of sliding decreased and approached a constant value of approximately 32.5N at the end of the test. This decreasing frictional force may be due to changes in oxide film thickness on the steel surface.

The surface profiles and roughness parameters of both the uncoated and the coated steel plates before and after dry sliding for 30 hours were determined using a computerized surface analyzer. Because of the large amount of heat generated during sliding, thermo-mechanical wear of the steel surface was observed. The arithmetic average roughness and wear indentations are shown in Table II for the different coatings. After dry sliding for 30 hours, the silver-rich coated plate showed the lowest arithmetic average roughness and a shallow wear indentation of approximately 141 $\mu$m when compared to other coated plates. The silver-rich or moly-rich coated plates have good wear resistance compared with bare steel plates.

TABLE II

Surface Roughness and Wear Indentation Analyses for Different Coatings and the Uncoated Steel Plate After 30 Hours of Sliding

| Surface Roughness Analyses | Bare Metal | Mo-Coated | Ag-Coated | Mo (66%)-Ag (34%) | Ag (50%)-Mo (50%) | Ag (69%) Mo (31%) |
|---|---|---|---|---|---|---|
| A.A.* ($\mu$m) | 5.16 | 5.34 | 4.77 | 4.19 | 3.85 | 3.65 |
| Wear Indentation ($\mu$m) | 192.3 | 251.1 | 134.8 | 160.3 | 130.0 | 140.9 |

*A.A. = Arithmetic Average Roughness in $\mu$m

The surface profiles and average roughness measurements of wear tracks of the uncoated and coated plates after sliding of 30 hours are shown in FIG. 2. After dry sliding for 30 hours, the uncoated plate was characterized by a severe wear scar. The arithmetic average mean roughness of the wear track on the uncoated plate increased to approximately 5.16 $\mu$m. The wear depth estimated from the lowest point of the wear scar to the horizontal reference line was approximately 192 $\mu$m. After co-deposition, the arithmetic average roughness of the wear scars for co-deposited silver-molybdenum coatings were between 3.65 $\mu$m for the silver-rich samples and 4.19 $\mu$m for the moly-rich samples. However, for single element films such as pure silver or pure molybdenum, the roughness values of the wear tracks 5.34$\mu$m, respectively. These values were close to the average roughness of 5.16 $\mu$m of the bare steel plate after the same 30 hours of dry sliding. Indentations were observed in the center region of all films as shown in FIG. 2. This data clearly shows that there is a synergistic effect on the friction-reducing and wear-resistance characteristics of the co-deposited films when compared to single element films of either pure silver or pure molybdenum. When silver and molybdenum are co-deposited together on the surface of the steel plates, its wear-resistant and friction-reducing properties are greatly improved over that of the pure elements. A twenty to thirty percent improvement has been noted.

After 30 hours of dry sliding, the molybdenum-rich coated samples had a smaller wear depth of 161 $\mu$m when compared to bare metal or molybdenum coated specimens. The silver-rich coated specimen also showed excellent wear resistance as indicated by a wear depth of 141 $\mu$m in Table II and FIG. 2.

To examine the microstructures of the wear track, scanning electron microscopy was utilized. We have discovered that after dry sliding for 30 hours, the uncoated and silver coated steel plates exhibit different degrees of wear damage. Based on the scanning electron microscopy analysis made at the center of the wear track of the uncoated plates, severe metal fatigue has occurred during the sliding process. A deep wear groove and the remains of numerous micro-fractures are observed in the worn areas.

The molybdenum-rich coated plates after dry sliding for five hours were also analyzed by scanning electron microscopy. Examination of the wear grooves generated in the worn areas revealed much shallower grooves compared with the deep grooves for uncoated steel plates. All coated surfaces have been subjected to minor plowing and wear due to repeated cyclic sliding. The wear track for the molybdenum-rich coated plates was also much smoother than the uncoated steel plates and characterized by a shallower wear depth of 161 $\mu$m compared with the uncoated plate of 192 $\mu$m.

The silver-rich coated plates were examined to have a much shallower wear depth of 141 $\mu$m as compared to the uncoated plates. In addition, silver-rich coated plates do not produce much deformation on the surface. The wear scar does not appear to be as deep as with the uncoated plates. It is believed that the nano-crystalline films formed by co-deposition produce less friction than do large grain size materials. It is possible that the formation of amorphous or nano-crystalline materials can reduce the Young's modulus of the film and enhance its friction-reducing properties when compared to bulk materials.

We have shown that friction-reducing and wear-resistant films can be produced by co-depositing different quantities of silver and molybdenum on iron substrates forming nano-crystalline binary mixtures. A suitable range for the ratios between silver and molybdenum is between 34 to 69 percent Ag and between 66 to 31 percent Mo. Since both the moly-rich (34 percent Ag, 66 percent Mo) coated films and the silver-rich (Ag 69 percent and Mo 31 percent) coated films perform satisfactorily in reducing friction and wear on steel surfaces, any suitable composition in-between these two ranges should perform equally well as a wear-reducing and friction-reducing coating material.

We have demonstrated that the silver/molybdenum co-deposited films can provide significantly lower friction during the first ten hours of dry sliding (up to a 20 percent reduction) when compared with uncoated steel samples. The benefits achieved by our co-deposited film is mainly due to its nano-crystalline binary structure and its low shear strength and high thermal conductivity. Our co-deposited friction-reducing film is able to effectively dissipate the frictional heat that contributes to thermo-mechanical wear and able to shear easily, therefore, reducing friction and micro-fracture-induced wear. Our co-deposited films also showed a synergistic effect and greatly improved results over single element film coatings of either silver or molybdenum alone.

The embodiments of the invention in which an exclusive property or privilege is claimed are defined as follows:

1. In a method of forming a friction-reducing and wear-resistant film on the surface of an iron object comprising the steps of
   positioning said iron object in a vacuum chamber,
   withdrawing air from said chamber until a vacuum is achieved,
   vaporizing simultaneously different sources of silver and molybdenum by means of electron-beam vaporization such that a silver and molybdenum film is deposited on the surface of said iron object, and
   removing said coated iron object from said chamber.

2. In a method of forming a friction-reducing and wear resistant film on the surface of an iron rising the steps of
   positioning said iron object in a chamber,
   withdrawing air from said chamber until a vacuum is achieved,
   vaporizing simultaneously different sources of silver and molybdenum by means of electron-beam vaporization such that a minimum thickness of 100 nano-meters of silver and molybdenum film is deposited on the surface of said iron object, and
   removing said coated iron object from said chamber.

3. In a method of forming a friction-reducing and wear-resistant film on the surface of an iron object comprising the steps of
  positioning said iron object in a vacuum chamber,
  withdrawing air from said chamber until a vacuum is achieved,
  vaporizing simultaneously different sources of silver and molybdenum by means of electron-beam vaporization such that a silver and molybdenum film is deposited on the surface of said iron object, said film having a composition of between 34 to 69 atomic percent silver and between 66 to 31 atomic percent molybdenum, and
  removing said coated iron object from said chamber.

4. In a method of forming a friction-reducing and wear-resistant film on the surface of an iron comprising the steps of
  positioning said iron object in a vacuum chamber,
  withdrawing air from said chamber until a vacuum is achieved,
  vaporizing simultaneously different sources of silver and molybdenum by means of electron-beam vaporization such that a silver and molybdenum film is deposited on the surface of said iron object,
  said film having a composition of between 34 to 69 atomic percent silver with the balance being molybdenum and having a nano-crystalline binary structure of crystals having sizes between 1 to 1000 nano-meters, and
  removing said coated iron surface from said chamber.

5. In the method of claim 4, said being at least $5.5 \times 10^{-9}$ torr.

6. In the method of claim 4, said film thickness of silver and molybdenum being at least 100 nano-meters.

7. In the method of claim 4, said different sources of silver and molybdenum being at lest 95% pure.

* * * * *